United States Patent
Chuuman et al.

(10) Patent No.: US 9,136,104 B2
(45) Date of Patent: Sep. 15, 2015

(54) METHOD FOR CLEANING SILICON WAFER AND APPARATUS FOR CLEANING SILICON WAFER

(75) Inventors: Takaaki Chuuman, Tokyo (JP); Takahiro Kawakatsu, Tokyo (JP); Katsunobu Kitami, Tokyo (JP); Hiroshi Morita, Tokyo (JP)

(73) Assignee: KURITA WATER INDUSTRIES LTD., Tokyo (JP)

( * ) Notice: Subject to any disclaimer, the term of this patent is extended or adjusted under 35 U.S.C. 154(b) by 58 days.

(21) Appl. No.: 13/884,350

(22) PCT Filed: Nov. 11, 2011

(86) PCT No.: PCT/JP2011/076025
§ 371 (c)(1),
(2), (4) Date: Jul. 23, 2013

(87) PCT Pub. No.: WO2012/067025
PCT Pub. Date: May 24, 2012

(65) Prior Publication Data
US 2013/0291891 A1 Nov. 7, 2013

(30) Foreign Application Priority Data

Nov. 15, 2010 (JP) ................. 2010-254602

(51) Int. Cl.
*B08B 7/04* (2006.01)
*H01L 21/02* (2006.01)
(Continued)

(52) U.S. Cl.
CPC ............ *H01L 21/02052* (2013.01); *B08B 3/00* (2013.01); *B08B 3/02* (2013.01); *B08B 3/04* (2013.01); *H01L 21/67057* (2013.01)

(58) Field of Classification Search
CPC ............. B08B 3/00; B08B 3/02; B08B 3/04; H01L 21/02052
USPC ............. 134/2, 3, 26, 28, 34, 36, 41, 42, 902
See application file for complete search history.

(56) References Cited

U.S. PATENT DOCUMENTS 5,759,751 A * 6/1998 Shimizu et al. ............... 430/329
2003/0108823 A1 6/2003 Muraoka et al.
(Continued)

FOREIGN PATENT DOCUMENTS

JP 06-029271 A 2/1994
JP 2001-062412 A 3/2001
(Continued)

OTHER PUBLICATIONS

International Search Report of the International Searching Authority mailed Feb. 14, 2012 for the corresponding international application No. PCT/JP2011/076025 (with English translation).
(Continued)

*Primary Examiner* — Bibi Carrillo
(74) *Attorney, Agent, or Firm* — Posz Law Group, PLC

(57) ABSTRACT

A silicon wafer after being cleaned by using a cleaning liquid is rinsed by using carbonic water. According to such a silicon wafer cleaning method, generation of static due to a rinsing treatment is not caused, so that an electrostatic breakdown is not caused, adhesion of dirt to a cleaned silicon wafer surface due to the static is not caused, adhesion of metal impurities can be prevented in the rinsing treatment of the silicon wafer and, while giving consideration to the cost, furthermore, a rinsing treatment using a clean rinsing liquid free from causing any residue can be performed.

7 Claims, 1 Drawing Sheet

(51) Int. Cl.
*B08B 3/04* (2006.01)
*B08B 3/00* (2006.01)
*B08B 3/02* (2006.01)
*H01L 21/67* (2006.01)

(56) References Cited

U.S. PATENT DOCUMENTS

| | | |
|---|---|---|
| 2004/0076912 A1 | 4/2004 | Muraoka et al. |
| 2004/0177655 A1 | 9/2004 | Kodera et al. |
| 2005/0133066 A1 | 6/2005 | Takahashi |
| 2006/0115774 A1* | 6/2006 | Wang et al. .......... 430/331 |
| 2007/0181148 A1* | 8/2007 | Yun et al. ............... 134/2 |
| 2008/0006302 A1* | 1/2008 | Araki et al. ............ 134/26 |
| 2008/0166872 A1* | 7/2008 | Takigawa ............ 438/637 |
| 2012/0231395 A1* | 9/2012 | Lee et al. ........... 430/319 |

FOREIGN PATENT DOCUMENTS

| | | |
|---|---|---|
| JP | 2002-050606 A | 2/2002 |
| JP | 2003-203856 A | 7/2003 |
| JP | 2004-273799 A | 9/2004 |
| JP | 2004-273961 A | 9/2004 |
| JP | 2005-040663 A | 2/2005 |
| JP | 2007-012860 A | 1/2007 |
| JP | 2007-134600 A | 5/2007 |

OTHER PUBLICATIONS

Office Action mailed Feb. 24, 2015 issued in corresponding JP patent application No. 2010-254602.

* cited by examiner

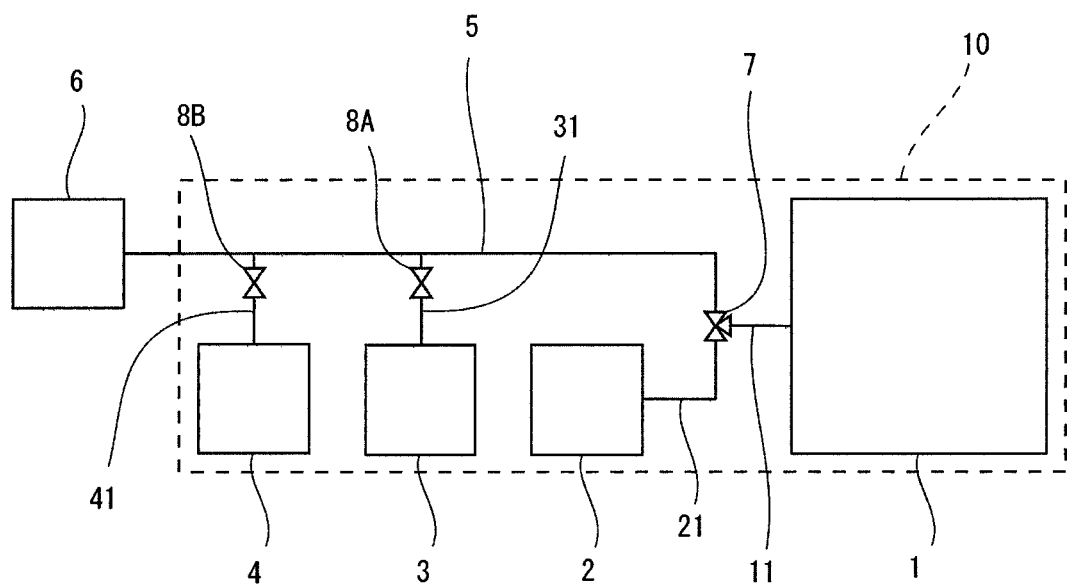

METHOD FOR CLEANING SILICON WAFER AND APPARATUS FOR CLEANING SILICON WAFER

CROSS REFERENCE TO RELATED APPLICATIONS

This application is a U.S. national stage application of PCT/JP2011/076025 filed on Nov. 11, 2011, and claims priority to, and incorporates by reference, Japanese Patent Application No. 2010-254602 filed on Nov. 15, 2010.

TECHNICAL FIELD

The present invention relates to a silicon wafer cleaning method and a silicon wafer cleaning apparatus for preventing impurities from adhering to silicon wafers in a wet cleaning process in a semiconductor manufacture process.

BACKGROUND ART

As manufacture process rules of semiconductor products become more rigorous for higher IC integration, inclusion of trace impurities largely affects on device performance and product yield of the semiconductor products. To prevent inclusion of trace impurities, rigorous contamination control has been required and a variety of cleaning is performed in each process in manufacture processes of semiconductor products.

Generally, as a semiconductor substrate (silicon wafer) cleaning liquid to be used in FEOL before forming a wiring pattern, a mixture of ammonia water, hydrogen peroxide water and water (SC-1) for the purpose of removing fine particles, a mixture of hydrochlonic acid, hydrogen peroxide water and water (SC-2) for the purpose of removing metals, dilute hydrofluoric acid, ozone water, a mixture of ozone water and dilute hydrofluoric acid, a mixture of sulfuric acid and hydrogen peroxide water (SPM) for the purpose of removing organic substances, and a mixture of sulfuric acid, ozone and water, etc. are used. They are used alone or in combination in accordance with the purposes.

In a conventional cleaning process (an RCA cleaning method and an improved cleaning methods thereof), after treating substrate surfaces with a cleaning liquid as above, a rinsing process for rinsing the substrates with ultrapure water for washing the cleaning liquid away is performed inevitably. At this time, if any contaminant even in a slight amount is in the ultrapure water, the contaminant adheres to the substrate surfaces, so that demands for purity of the ultrapure water for rinsing have been very high.

However, demands for purity of ultrapure water for rinsing in recent years are liable to be too high disregarding costs and conveniences for fear of causing adhesion of contaminants to substrate surfaces. Particularly, in the case of metals which become a problem of contaminants, since it is safer to lower a concentration of trace metals in the ultrapure water, the current situation is to just focus on lowering the entire concentration without verifying the effects that what components should be decreased to what level.

When using ultrapure water as a rinsing liquid, a high specific resistance value of ultrapure water results in problems, such that static generates in the rinsing treatment to cause an electrostatic breakdown or dirt adheres to cleaned substrate surfaces due to the static. To solve the problems, a technique of dissolving ammonia in the ultrapure water is disclosed in the patent article 1.

On the other hand, the patent article 2 discloses a cleaning method of removing metal impurities adhered to substrate surfaces by bringing cleaning subjects contact with a cleaning liquid obtained by dissolving an ozone gas and carbon dioxide in pure water or ultrapure water.

Furthermore, the patent article 3 describes that, when rinsing substrates having metal wirings formed thereon by using ultrapure water, ultrapure water containing a chelate agent is used as a rinsing liquid so as to prevent metal adhesion as well as re-adhesion of metals, once dissolved from the metal wirings on the substrate surfaces due to the ultrapure water, to the substrates.

PRIOR ART DOCUMENTS

Patent Documents

[Patent Document 1] Japanese Patent Publication (Kokai) No. 2004-273799
[Patent Document 2] Japanese Patent Publication (Kokai) No. 2001-062412
[Patent Document 3] Japanese Patent Publication (Kokai) No. 2002-050606

SUMMARY OF THE INVENTION

Object(s) to be Attained by the Invention

However, the cleaning liquid containing carbonic acid proposed by the patent article 2 focuses on an advantage of adding carbonic acid to ozone to be used for cleaning as a substitute of chemicals for substrate cleaning. And it is not a method to be used for preventing adhesion of metals only by carbonic water.

Also, it is not preferable to use a rinsing liquid, which is obtained by adding chemicals to ultrapure water as described in the patent article 3, even for substrate surfaces of oxide films and nitride films, etc. hard to be etched by ultrapure water originally. And it is desired to use clean rinsing liquid free from causing any residue.

The present invention was made in consideration of the above problems and has an object thereof to provide a silicon wafer cleaning method and a silicon wafer cleaning apparatus, wherein generation of static due to a rinsing treatment is not caused, so that an electrostatic breakdown is not caused, adhesion of dirt to cleaned silicon wafer surfaces due to the static is not caused, adhesion of metal impurities can be prevented in the rinsing treatment of silicon wafers and, while giving consideration to the cost, furthermore, a rinsing treatment using a clean rinsing liquid free from causing any residue can be performed.

Means to Attain the Objects

To attain the objects above, firstly, the present invention provides a silicon wafer cleaning method characterized in that a silicon wafer after being cleaned by using a cleaning liquid is rinsed by using carbonic water (Invention 1).

According to the invention above (Invention 1), as a result of washing a cleaning liquid remaining on silicon wafer surfaces away with carbonic water, an anionic property on the silicon wafer surfaces is reduced by the carbonic water, consequently, an affinity of cationic metals to the silicon wafer surfaces is reduced. Thereby, it is possible to prevent metal impurities from adhering to silicon wafer surfaces in a rinsing treatment of the silicon wafers and, without using as the rinsing liquid ultrapure water having unnecessarily high purity disregarding costs, it is possible to perform a rinsing treatment using carbonic water as a clean rinsing liquid free from causing any residue. Also, as in the case of using ultrapure water as a rinsing liquid, it is possible to prevent problems, such that static is generated in the rinsing treatment so that an electrostatic breakdown is caused and dirt adheres to cleaned silicon wafer surfaces due to the static. Furthermore, by using a silicon wafer, wherein adhesion of metal impurities and dirt to the surfaces is prevented, as a material, it is possible to manufacture semiconductor products having higher qualities.

In the invention above (Invention 1), the silicon wafer after being rinsed by using the carbonic water may be rinsed by using ultrapure water (Invention 2).

According to the invention above (Invention 2), as a result of furthermore rinsing with ultrapure water after the rinsing treatment with carbonic water, the carbonic water is washed away and, when metals being liable to deposit by forming compounds with carbonic acid are present near silicon wafers, it is possible to prevent the metals from forming compounds with carbonic acid.

In the inventions above (Inventions 1 and 2), preferably, carbonic water, wherein a carbon dioxide concentration is adjusted based on an analyzing result of a metal adhesion amount on the silicon wafer after being cleaned by the silicon wafer cleaning method, is used for rinsing the silicon wafer after being cleaned by using the cleaning liquid (Invention 3).

According to the invention above (Invention 3), since the concentration of carbon dioxide in the carbonic water can be determined and adjusted in accordance with an adhesion amount of metals on the cleaned silicon wafer surfaces, a rinsing treatment using more effective carbonic water can be performed on the silicon wafer.

In the inventions above (Inventions 1 to 3), a rinsing treatment using the carbonic water may be performed in a cleaning tank used for cleaning using the cleaning liquid (Invention 4) or the rinsing treatment by using the carbonic water may be performed in a different cleaning tank from the cleaning tank used for cleaning using the cleaning liquid (Invention 5).

In the inventions above (Inventions 1 to 5), the carbonic water may be prepared by a method of dissolving carbon dioxide in ultrapure water by using a gas permeable membrane, a method of feeding carbon dioxide into a line for ultrapure water to flow, or a method of bringing carbonate type ion-exchange resin contact with ultrapure water to slowly release carbon dioxide in the ultrapure water (Invention 6).

Secondary, according to the present invention, there is provided a silicon wafer cleaning apparatus, characterized by comprising a cleaning tank for performing a cleaning treatment on a silicon wafer by using a cleaning liquid and a carbonic water supplier for supplying carbonic water to the cleaning tank: wherein carbonic water supplied from the carbonic water supplier to the cleaning tank is used for rinsing a silicon wafer after being cleaned by using the cleaning liquid (Invention 7).

According to the invention above (Invention 7), in the cleaning tank for performing a cleaning treatment of silicon wafers by using a cleaning liquid, as a result that the cleaning liquid remaining on silicon wafer surfaces is washed away with carbonic water supplied from the carbonic water supplier, an anionic property on the silicon wafer surfaces is reduced, consequently, an affinity of cationic metals to the silicon wafer surfaces is reduced. Therefore, it is possible to prevent metal impurities from adhering to the silicon wafer surfaces in the rinsing treatment of the silicon wafers and, without using as the rinsing liquid ultrapure water having unnecessarily high purity disregarding costs, it is possible to perform a rinsing treatment using carbonic water as a clean rinsing liquid free from causing any residue. Also, as in the case of using ultrapure water as a rinsing liquid, it is possible to prevent problems, such that static is generated in the rinsing treatment so that an electrostatic breakdown is caused and dirt adheres to cleaned silicon wafer surfaces due to the static. Furthermore, by using a silicon wafer, wherein adhesion of metal impurities and dirt to the surfaces is prevented, as a material, it is possible to manufacture semiconductor products having higher qualities.

In the invention above (Invention 7), an ultrapure water supplier for supplying ultrapure water to the cleaning tank is furthermore provided: wherein after rinsing the silicon wafer by using the carbonic water, ultrapure water supplied from the ultrapure water supplier to the cleaning tank may be used for rinsing the silicon wafer (Invention 8).

According to the invention above (Invention 8), as a result of rinsing the silicon wafer with ultrapure water supplied from the ultrapure water supplier to the cleaning tank after the rinsing treatment with carbonic water, the carbonic water is washed away and, when metals being liable to deposit by forming compounds with carbonic acid are present near a silicon wafer, it is possible to prevent the metals from forming compounds with carbonic acid.

In the inventions (Invention 7 and 8) above, preferably, a cleaning liquid supplier for supplying a cleaning liquid to the cleaning tank and a liquid supply unit for switching a supply of the cleaning liquid and the carbonic water to the cleaning tank are furthermore provided (Invention 9).

According to the invention above (Invention 9), since a cleaning liquid and carbonic water can be supplied to the cleaning tank while switching, silicon wafers cleaned with a cleaning liquid can be rinsed with carbonic water efficiently.

Thirdly, according to the present invention, there is provided a silicon wafer cleaning apparatus, characterized by comprising a cleaning tank for performing a cleaning treatment of a silicon wafer, a rinsing tank for performing a rinsing treatment of a silicon wafer after being subjected to a cleaning treatment in the cleaning tank, and a carbonic water supplier for supplying carbonic water to the rinsing tank: wherein carbonic water supplied from the carbonic water supplier to the rinsing tank is used for rinsing a silicon wafer after being cleaned in the cleaning tank (Invention 10).

According to the invention above (Invention 10), after a cleaning treatment with a cleaning liquid is performed on a silicon wafer in the cleaning tank, as a result of washing the cleaning liquid remaining on the silicon wafer surface away with carbonic water supplied from carbonic water supplier in the rinsing tank, an anionic property on the silicon wafer surface is reduced by the carbonic water, consequently, an affinity of cationic metals to the silicon wafer surface is reduced. Thereby, it is possible to prevent metal impurities from adhering to the silicon wafer surface in a rinsing treatment of the silicon wafer and, without using as the rinsing liquid ultrapure water having unnecessarily high purity disregarding costs, it is possible to perform a rinsing treatment using carbonic water as a clean rinsing liquid free from causing any residue. Also, as in the case of using ultrapure water as a rinsing liquid, it is possible to prevent problems, such that static is generated in the rinsing treatment so that an electrostatic breakdown is caused and dirt adheres to cleaned silicon wafer surfaces due to the static. Furthermore, by using a silicon wafer, wherein adhesion of metal impurities and dirt to the surfaces is prevented, as a material, it is possible to manufacture semiconductor products having higher qualities.

In the inventions above (Inventions 7 to 10), preferably, carbonic water, wherein a carbon dioxide concentration is adjusted based on an analyzing result of a metal adhesion amount on the silicon wafer after being cleaned by the silicon wafer cleaning apparatus, is used for rinsing the silicon wafer after being cleaned by using the cleaning liquid (Invention 11).

According to the invention above (Invention 11), since a concentration of carbon dioxide in carbonic water can be determined and adjusted in accordance with an adhesion amount of metals on cleaned silicon wafer surfaces, a rinsing treatment by using more effective carbonic water can be performed on the silicon wafers.

Effects of the Invention

According to the silicon wafer cleaning method and a silicon wafer cleaning apparatus of the present invention, generation of static due to a rinsing treatment is not caused, so that an electrostatic breakdown is not caused, adhesion of dirt to cleaned silicon wafer surfaces due to static is not caused, adhesion of metal impurities can be prevented in the rinsing treatment of silicon wafers and, while giving consideration to the cost, furthermore, a rinsing treatment using a clean rinsing liquid free from causing any residue can be performed.

BRIEF DESCRIPTION OF DRAWINGS

FIG. 1 A schematic view showing a silicon wafer cleaning apparatus according to an embodiment of the present invention.

MODE(S) FOR CARRYING OUT THE INVENTION

Below, an explanation will be made on an embodiment of the present invention with reference to the drawing. FIG. 1 is a schematic view showing a silicon wafer cleaning apparatus according to an embodiment of the present invention.

As shown in FIG. 1, a silicon wafer cleaning apparatus 10 according to the present embodiment comprises a cleaning tank 1, a dilute hydrofluoric acid supplier 2, a carbon dioxide supplier 3, an ozone gas supplier 4 and an ultrapure water supply line 5.

In the cleaning tank 1, a not illustrated wafer holder is provided, and silicon wafers as cleaning subjects are mounted on the wafer holder and placed inside the cleaning tank 1.

One end of the ultrapure water supply line 5 is connected to an ultrapure water producing system 6, and the other end is connected to one inlet port of three-way switch valve 7. Also, a dilute hydrofluoric acid supply tube 21 connected to the dilute hydrofluoric acid supplier 2 is connected to the other inlet port of the three-way switch valve 7, and a liquid supply tube 11 connected to the cleaning tank 1 is connected to an outlet port of the three-way switch valve 7. Consequently, ultrapure water W produced by the ultrapure water producing system 6 is supplied to the cleaning tank 1 via the ultrapure water supply line 5 and the three-way switch valve 7, and dilute hydrofluoric acid is supplied to the cleaning tank 1 via the dilute hydrofluoric acid supply tube 21 and the three-way switch valve 7.

In the middle of the ultrapure water supply line 5, the carbon dioxide supplier 3 is connected via a carbon dioxide supply tube 31, and the ozone gas supplier 4 is connected via an ozone gas supply tube 41. In the middle of the carbon dioxide gas supply tube 31 and of the ozone gas supply tube 41, valves 8A and 8B are provided, respectively. Thereby, by opening and closing the valves 8A and 8B, it is possible to control supplying of carbon dioxide from the carbon dioxide supplier 3 or ozone gas from the ozone gas supplier 4 to the ultrapure supply line 5.

The dilute hydrofluoric acid supplier 2 supplies dilute hydrofluoric acid as a cleaning liquid to the cleaning tank 1 via the three-way switch valve 7 and liquid supply tube 11. By operating the three-way switch valve 7, it is possible to switch between a supply of ultrapure water from the ultrapure water supply line 5 to the cleaning tank 1 and a supply of dilute hydrofluoric acid from the dilute hydrofluoric acid supplier 2 to the cleaning tank 1.

Namely, the silicon wafer cleaning apparatus 10 according to the present embodiment is capable of switching a liquid to be supplied to the cleaning tank 1 freely by operating the three-way switch valve 7 and valves 8A and 8B. For example, by operating the three-way switch valve 7 to open only a flow path from the dilute hydrofluoric acid supplier 2 to the liquid supply tube 11, dilute hydrofluoric acid can be supplied to the cleaning tank 1. Also, by operating the three-way switch valve 7 to open only a flow path from the ultrapure water supply line 5 to the liquid supply tube 11, ultrapure water can be supplied to the cleaning tank 1. Furthermore, by opening the valve 8A in this state to supply carbon dioxide from the carbon dioxide supplier 3 to the ultrapure water, carbonic water can be supplied to the cleaning tank 1; while when closing the valve 8A and opening the valve 8B to supply an ozone gas from the ozone gas supplier 4 to the ultrapure water, ozone water can be supplied to the cleaning tank 1. By opening both of the valves 8A and 8B, carbon dioxide and ozone gas are supplied to the ultrapure water and ozone water containing carbonic acid can be supplied to the cleaning tank 1.

Note that, in the present embodiment, the silicon wafer cleaning apparatus 10 is provided with a dilute hydrofluoric acid supplier 2 for supplying dilute hydrofluoric acid as a cleaning liquid to the cleaning tank 1, however, it is not limited to that and, for example, the cleaning liquid may be a mixture of ammoniac water, hydrogen peroxide water and water, a mixture of hydrochlonic acid, hydrogen peroxide water and water, a mixture of sulfuric acid and hydrogen peroxide water, and a mixture of sulfuric acid, ozone and water, etc. in accordance with the cleaning purpose, and they may be combined in accordance with the use purposes. Also, the silicon wafer cleaning apparatus 10 may be provided with devices capable of supplying respective cleaning liquids to be required.

As the carbon dioxide supplier 3 provided to the silicon wafer cleaning apparatus 10, for example, a carbon dioxide cylinder, etc. may be mentioned, however, it is not particularly limited and can be any as long as it can supply carbon dioxide. Note that the carbon dioxide supplier 3 is preferably capable of controlling a supply amount of carbon dioxide, so that a carbon dioxide concentration in carbonic water to be supplied to the cleaning tank 1 can be adjusted precisely to a predetermined concentration.

As the ozone gas supplier 4 provided to the silicon wafer cleaning apparatus 10, for example, a discharge-type ozone gas producing apparatus using silent discharge or creeping discharge, etc. and an electrolytic ozone gas producing apparatus, etc. may be mentioned, however, it is not particularly limited and can be any as long as it is capable of supplying an ozone gas. Note that the ozone gas supplier 4 is preferably capable of controlling a supply amount of ozone gas, so that an ozone concentration in ozone water to be supplied to the cleaning tank 1 can be adjusted precisely to a predetermined concentration.

A cleaning treatment and a rinsing treatment of a silicon wafer in the silicon wafer cleaning apparatus 10 according to the present embodiment are performed as below.

First, silicon wafers as cleaning subjects are mounted on a wafer holder (not illustrated) and placed inside the cleaning tank 1. Next, the three-way switch valve 7 was operated to open only the flow path from the dilute hydrofluoric acid supplier 2 to the supply tube 11, so that a supply of dilute hydrofluoric acid at a predetermined concentration to the cleaning tank 1 starts. By supplying dilute hydrofluoric acid to the cleaning tank 1 for predetermined duration, cleaning of the silicon wafers is performed. As a result of the cleaning, metal impurities are removed from silicon wafer surfaces and a surface to be a ground for forming oxide film is exposed.

After that, by operating the three-way switch valve 7 to open only the flow path from the ultrapure water supply line 5 to the supply tube 11, the supply of dilute hydrofluoric acid stops and a supply of ultrapure water to the cleaning tank 1 starts, and a rinsing treatment of the silicon wafers is performed for predetermined duration.

After the rinsing treatment, the valve 8B is opened to supply an ozone gas to ultrapure water flowing through the ultrapure water supply line 5 and, at the same time, the valve 8A is opened to supply carbon dioxide to ultrapure water W flowing through the ultrapure water supply line 5. As a result, a supply of ozone water containing carbonic acid to the cleaning tank 1 via the liquid supply tube 11 starts. By supplying the ozone water containing carbonic acid to the cleaning tank 1 for predetermined duration, cleaning of silicon wafers is performed. The silicon wafer cleaning apparatus 10 according to the present embodiment can remove metal impurities from silicon wafer surfaces and form an oxide film on the silicon wafer surfaces through performing such a cleaning treatment.

An ozone concentration in the ozone water containing carbonic acid supplied to the cleaning tank 1 is 100 ppm or lower, preferably 1 to 50 ppm and particularly preferably 5 to 20 ppm. When the ozone concentration in the ozone water to be supplied to the cleaning tank 1 is lower than 1 ppm, it is liable that a film thickness of a silicon oxide film formed on silicon wafers become insufficient, while when it exceeds 100 ppm, an oxidation reaction becomes too active, so that a uniform silicon oxide film is hard to be formed and it results in forming an oxide film having a high COOH group ratio.

A carbon dioxide concentration in the ozone water containing carbonic acid to be supplied to the cleaning tank 1 is 10 ppm or lower, preferably 1 to 5 ppm, and particularly preferably 1 to 3 pm.

After the cleaning treatment with ozone water containing carbonic acid, the valve 8B is closed to stop supplying an ozone gas while leaving the valve 8A open, so that a supply of carbonic water to the cleaning tank 1 starts and a rinsing treatment with carbonic water is performed on silicon wafers for predetermined duration. The silicon wafer cleaning apparatus 10 according to the present embodiment can wash away the ozone water as a cleaning liquid from silicon wafer surfaces and prevent adhesion of metal impurities to the silicon wafer surfaces through such a rinsing treatment. Note that a carbon dioxide concentration in carbonic water to be supplied to the cleaning tank 1 may be same as a carbon dioxide concentration in the ozone water containing carbonic acid above.

Furthermore, after a predetermined duration, by closing the valve 8A to stop the supply of carbon dioxide, only ultrapure water W is supplied to the cleaning tank 1 and a rinsing treatment with the ultrapure water is performed on the silicon wafers for predetermined duration. In the silicon wafer cleaning apparatus 10 according to the present embodiment, carbonic water is washed away by performing the rinsing treatment with ultrapure water and, when metals being liable to deposit by forming forms compounds with carbonic acid are present near silicon wafers, it is possible to prevent the metals from forming compounds with carbonic acid.

As the ultrapure water to be supplied from the ultrapure water producing system 6 to the ultrapure water supply line 5, it is preferable to have a specific resistance value of 18 MΩ·cm or higher and TOC of 5 ppb or lower.

Note that the silicon wafer cleaning apparatus 10 according to the present embodiment is provided with only one cleaning tank 1, however, it is not limited to that and, for example, a plurality of cleaning tanks may be provided to a silicon wafer cleaning apparatus to perform different cleaning treatments in the respective cleaning tanks, or a rinsing tank may be provided separately from the cleaning tank so as to perform a rinsing treatment in the rinsing tank. Specifically, it may be configured that a silicon wafer cleaning apparatus comprises a cleaning tank and a rinsing tank, wherein a cleaning treatment using dilute hydrofluoric acid and a cleaning treatment using ozone water containing carbonic acid are performed in the cleaning tank, and a rinsing treatment using carbonic water and a rinsing treatment using ultrapure water are performed in the rinsing tank. Alternatively, it may be configured that a silicon wafer cleaning apparatus comprises a first cleaning tank, a second cleaning tank and a rinsing tank, wherein a cleaning treatment using dilute hydrofluoric acid is performed in the first cleaning tank, a cleaning treatment using ozone water containing carbonic acid is performed in the second cleaning tank, and a rinsing treatment using carbonic water and a rinsing treatment using ultrapure water are performed in the rinsing tank.

Also, the silicon wafer cleaning apparatus 10 according to present embodiment is configured that the carbon dioxide supplier 3 is connected to the ultrapure water supply line 5 via the carbon dioxide supply tube 31 and valve 8A, and carbonic water to be used in a rinsing treatment is prepared by a method of feeding carbon dioxide to a line for ultrapure water to flow. However, it is not limited to that and, for example, carbonic water to be used for a rinsing treatment may be prepared by a method of dissolving carbon dioxide in ultrapure water by using a gas permeable membrane, or carbonic water to be used for a rinsing treatment may be prepared by a method of slowly releasing carbon dioxide in ultrapure water by bringing carbonate type ion-exchange resin contact with the ultrapure water.

EXAMPLES

Below, the present invention will be explained further in detail by using examples and comparative examples. However, the present invention is not limited to the examples in any ways. Note that P-type silicon wafers (made by Shin-Etsu Handotai Co., Ltd: resistance value was 8 to 120 Ω·cm) were used as silicon wafers in the examples and comparative examples below. A metal impurity to be a standard was Fe.

Comparative Example 1

In the silicon wafer cleaning apparatus 10 shown in FIG. 1, a silicon wafer was mounted on the wafer holder and placed in the cleaning tank 1. First, the three-way switch valve 7 was operated to open a flow path from the dilute hydrofluoric acid supplier 2 to the liquid supply tube 11, so that 2%-dilute hydrofluoric acid was supplied to the cleaning tank 1 for 2 minutes. After metal impurities were removed and a surface to be a ground for forming oxide film was exposed, a 2-minute rinsing treatment was performed by using ultrapure water (Fe concentration was 1 ng/L).

After the rinsing treatment, by operating the three-way switch valve 7 to open a flow path from the ultrapure water supply line 5 to the liquid supply tube 11 and opening the valve 8B to supply an ozone gas in an amount of 15 ppm from the ultrapure water producing system 6 to ultrapure water in the ultrapure water supply line 5 at the same time as opening the valve 8A to supply 1 ppm of carbon oxide from the carbon dioxide supplier 3 to the ultrapure water, ozone water containing carbonic acid was fed to the cleaning tank 1 for 20 minutes so as to remove metal impurities and to form an oxide film on the silicon wafer surface.

After the oxide film was formed, both of the valves 8A and 8B were closed to stop the supply of ozone gas from the ultrapure water producing system 6 and the supply of carbon dioxide from the carbon dioxide supplier 3. As a result, ultrapure water W is supplied to the cleaning tank 1, and a rinsing treatment using ultrapure water W was performed for 15 minutes.

The silicon wafer after undergoing the processes up to here was dried in a clean atmosphere. When an Fe adhesion amount on the dried silicon wafer was analyzed by using a vapor phase decomposition and ICP/MS, a concentration of Fe elements on wafer was $2.2 \times 10^{10}$ atoms/cm$^2$.

Comparative Example 2

In the silicon wafer cleaning apparatus 10 shown in FIG. 1, a silicon wafer was mounted on the wafer holder and placed in the cleaning tank 1. Then, the three-way switch valve 7 was operated to open a flow path from the dilute hydrofluoric acid supplier 2 to the liquid supply tube 11, so that 2%-dilute hydrofluoric acid was supplied to the cleaning tank 1 for 2 minutes. After metal impurities were removed and a surface to be a ground for forming oxide film was exposed, a 2-minute rinsing treatment was performed by using ultrapure water (Cu concentration was 1 ng/L).

The silicon wafer after undergoing the steps up to here was dried in a clean atmosphere. When analyzing a Cu adhesion amount on the dried silicon wafer by using a vapor phase decomposition and TXRF (total reflection fluorescent X-ray), a concentration of Cu elements on wafer was $3.7 \times 10^{10}$ atoms/cm$^2$.

Example 1

In the silicon wafer cleaning apparatus 10 as shown in FIG. 1, a silicon wafer was mounted on the wafer holder and placed in the cleaning tank 1. First, the three-way switch valve 7 was operated to open a flow path from the dilute hydrofluoric acid supplier 2 to the liquid supply tube 11, so that 2%-dilute hydrofluoric acid was supplied to the cleaning tank 1 for 2 minutes, wherein metal impurities were removed and a surface to be a ground for forming oxide film were exposed. Subsequently, the three-way switch valve 7 was operated to open the flow path from the ultrapure water supply line 5 to the liquid supply tube 11, and a two-minute rinsing treatment was performed by using ultrapure water W (Fe concentration was 1 ng/L).

After the rinsing treatment, the three-way switch valve 7 was operated to open a flow path from the ultrapure water supply line 5 to the liquid supply tube 11, the valve 8B was operated to supply an ozone gas in an amount of 15 ppm from the ozone gas supplier 4 to ultrapure water and, at the same time, the valve 8A was opened to supply 1 ppm of carbon dioxide from the carbon dioxide supplier 3 to the ultrapure water, so that ozone water containing carbonic acid was fed to the cleaning tank 1 for 20 minutes, wherein metal impurities were removed and an oxide film was formed on the silicon wafer surface.

After the oxide film was formed, the valve 8B was closed while leaving the valve 8A open so as to stop only a supply of an ozone gas from the ozone gas supplier 4, and a rinsing treatment by using carbonic water was performed for 10 minutes. After that, the valve 8A was closed to stop a supply of carbon dioxide, and a rinsing treatment by using ultrapure water W was performed for 5 minutes.

The silicon wafer after undergoing the steps up to here was dried in a clean atmosphere. When analyzing an Fe adhesion amount on the dried silicon wafer by using a vapor phase decomposition and ICP/MS, a concentration of Fe elements on wafer was $5.1 \times 10^9$ atoms/cm$^2$.

Example 2

Other than using ultrapure water having an Fe concentration of 5 ng/L, a cleaning treatment of a silicon wafer was performed in the same way as in the example 1. When analyzing an Fe adhesion amount on the dried silicon wafer by using a vapor phase decomposition and ICP/MS, a concentration of Fe elements on wafers was $4.3 \times 10^{10}$ atoms/cm$^2$.

Example 3

Other than feeding back a metal adhesion amount in the example 2 and changing the carbon dioxide to be supplied from the carbon dioxide supplier 3 to ultrapure water to 5 ppm, a cleaning treatment of a silicon wafer was performed in the same way as in the example 2. When analyzing an Fe adhesion amount on the dried silicon wafer by using a vapor phase decomposition and ICP/MS, a concentration of Fe elements on wafer was reduced to $8.9 \times 10^9$ atoms/cm$^2$.

Example 4

In the silicon wafer cleaning apparatus 10 as shown in FIG. 1, a silicon wafer was mounted on the wafer holder and placed in the cleaning tank 1. First, the three-way switch valve 7 was operated to open a flow path from the dilute hydrofluoric acid supplier 2 to the liquid supply tube 11, so that 2%-dilute hydrofluoric acid was supplied to the cleaning tank 1 for 2 minutes, wherein metal impurities were removed and a surface to be a ground for forming oxide film was exposed. Subsequently, the three-way switch valve 7 was operated to open a flow path from the ultrapure water supply line 5 to the liquid supply tube 11 and the valve 8A was opened, so that 1 ppm of carbon dioxide was supplied from the carbon dioxide supplier 3 to ultrapure water W (a Cu concentration was 1 ng/L), and a two-minute rinsing treatment was performed by using carbonic water.

The silicon wafer after undergoing the steps up to here was dried in a clean atmosphere. When analyzing a Cu adhesion amount on the dried silicon wafer by using a vapor phase decomposition and TXRF (total reflection fluorescent X-ray), a concentration of Cu elements on wafer was $3.2 \times 10^9$ atoms/cm$^2$.

From the comparative examples and examples above, it was confirmed that, in a rinsing treatment of a silicon wafer, carbonic water can be used as a clean rinsing liquid free from causing any residue, it was unnecessary to use as the rinsing liquid ultrapure water having unnecessarily high purity disregarding costs, and adhesion of metal impurities (Fe) was suppressed sufficiently.

INDUSTRIAL APPLICABILITY

According to the present invention, adhesion of metal impurities is prevented in a rinsing treatment of silicon wafers, while giving consideration to the cost. Furthermore, it is useful as a silicon wafer cleaning method using a clean rinsing liquid free from causing any residue.

EXPLANATION OF REFERENCE NUMBERS

10 . . . silicon wafer cleaning apparatus
1 . . . cleaning tank
3 . . . carbon dioxide supplier
4 . . . ozone gas supplier
5 . . . ultrapure water supply line
7 . . . three-way switch valve
8A and 8B . . . valve

The invention claimed is:

1. A silicon wafer cleaning method, comprising steps of:
   a) providing at least one silicon wafer;
   b) cleaning the at least one silicon wafer with a cleaning liquid;
   c) measuring an amount of metal adhering to the at least one cleaned silicon wafer;
   d) providing a rinse comprising carbonic water having carbon dioxide;
   e) adjusting a concentration of carbon dioxide present in the carbonic water based on the measured amount of metal adhering to the at least one silicon wafer after the cleaning step; and
   f) rinsing the at least one silicon wafer after the cleaning step with the carbonic water having the adjusted concentration of carbon dioxide.

2. The silicon wafer cleaning method according to claim 1, wherein
   after the step of rinsing the at least one silicon wafer using the carbonic water, the at least one silicon wafer is rinsed using ultrapure water.

3. The silicon wafer cleaning method according to claim 1, further comprising:
   supplying ultrapure water from an ultrapure water source to a cleaning tank using an ultrapure water supply line;
   supplying the carbon dioxide for the carbonic water from a source of carbon dioxide into the ultrapure water supply line through a valve; and
   supplying the carbonic water to the cleaning tank using the ultrapure water supply line, wherein
   the valve is used to change an amount of the carbon dioxide supplied to the ultrapure water supply line when adjusting the concentration of carbon dioxide present in the carbonic water.

4. The silicon wafer cleaning method according to claim 2, wherein
   the rinsing step using the carbonic water is performed in a different cleaning tank from a cleaning tank used for the cleaning step using the cleaning liquid.

5. The silicon wafer cleaning method according to claim 1, further comprising repeating steps a) through f) on a plurality of silicon wafers.

6. The silicon wafer cleaning method according to claim 4, wherein the carbonic water is prepared by a method selected from the group consisting of:
   dissolving carbon dioxide in ultrapure water by using a gas permeable membrane,
   feeding carbon dioxide into an ultrapure water supply line that supplies ultrapure water to the different cleaning tank, and
   bringing a carbonate ion-exchange resin into contact with ultrapure water and slowly releasing carbon dioxide into the ultrapure water.

7. The silicon wafer cleaning method according to claim 5, wherein
   after each step of rinsing each silicon wafer using the carbonic water, each silicon wafer is rinsed using ultrapure water.

* * * * *